United States Patent
Shih et al.

(10) Patent No.: US 10,276,372 B2
(45) Date of Patent: Apr. 30, 2019

(54) METHOD FOR INTEGRATED CIRCUIT PATTERNING

(71) Applicant: Taiwan Semiconductor Manufacturing Company, Ltd., Hsin-Chu (TW)

(72) Inventors: Chih-Tsung Shih, Hsinchu (TW); Shinn-Sheng Yu, Hsinchu (TW); Jeng-Horng Chen, Hsinchu (TW); Anthony Yen, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/672,908

(22) Filed: Aug. 9, 2017

(65) Prior Publication Data

US 2017/0338103 A1     Nov. 23, 2017

Related U.S. Application Data

(63) Continuation of application No. 14/645,047, filed on Mar. 11, 2015, now abandoned.

(60) Provisional application No. 62/042,898, filed on Aug. 28, 2014.

(51) Int. Cl.
*H01L 21/027* (2006.01)
*G03F 7/40* (2006.01)

(52) U.S. Cl.
CPC ............ *H01L 21/0273* (2013.01); *G03F 7/40* (2013.01)

(58) Field of Classification Search
CPC .............................. H01L 21/0273; G03F 7/40
See application file for complete search history.

(56) References Cited

U.S. PATENT DOCUMENTS

| | | | |
|---|---|---|---|
| 6,271,154 B1 * | 8/2001 | Shen ........................ | G03F 7/40 216/49 |
| 8,133,804 B1 | 3/2012 | Godet et al. | |
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2004/0072443 A1 * | 4/2004 | Huang .............. | H01L 21/31116 438/710 |

(Continued)

FOREIGN PATENT DOCUMENTS

| | | |
|---|---|---|
| CN | 103155090 | 6/2013 |
| KR | 100653534 | 11/2006 |

(Continued)

*Primary Examiner* — Duy Vu N Deo
*Assistant Examiner* — Mahmoud Dahimene
(74) *Attorney, Agent, or Firm* — Haynes and Boone, LLP

(57) ABSTRACT

A method includes patterning a resist layer formed over a substrate, resulting in a resist pattern; and transferring the resist pattern to an anti-reflection coating (ARC) layer formed under the resist layer and over the substrate, resulting in a patterned ARC layer. The method further includes treating the patterned ARC layer with an ion beam, resulting in a treated patterned ARC layer, wherein the ion beam is generated with a first gas and is directed towards the patterned ARC layer at a tilt angle at least 10 degrees. The method further includes etching the substrate with the treated patterned ARC layer as an etch mask.

20 Claims, 13 Drawing Sheets

(56) References Cited

U.S. PATENT DOCUMENTS

| | | | |
|---|---|---|---|
| 2005/0272265 A1* | 12/2005 | Geffken | H01L 21/3105 438/706 |
| 2009/0149024 A1* | 6/2009 | Huang | H01L 21/0332 438/670 |
| 2011/0186749 A1 | 8/2011 | Godet et al. | |
| 2013/0062309 A1 | 3/2013 | Godet et al. | |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0272728 A1 | 9/2014 | Sinclair et al. | |
| 2014/0273521 A1 | 9/2014 | Wu et al. | |
| 2016/0064239 A1 | 3/2016 | Shih et al. | |

FOREIGN PATENT DOCUMENTS

| | | |
|---|---|---|
| KR | 20130124149 | 11/2013 |
| KR | 20130138786 | 12/2013 |
| WO | WO2011/116039 | 9/2011 |

* cited by examiner

METHOD FOR INTEGRATED CIRCUIT PATTERNING

This is a continuation of U.S. patent application Ser. No. 14/645,047, filed Mar. 11, 2015, which claims the benefits of U.S. Prov. No. 62/042,898 entitled "Method for Integrated Circuit Patterning," filed Aug. 28, 2014, both of which are herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, lithography is a technique frequently used in IC manufacturing for transferring IC designs to a semiconductor substrate. A typical lithography process includes coating a resist (or photo resist) over a substrate, exposing the resist to a radiation such as deep ultraviolet (DUV) ray or extreme ultraviolet (EUV) ray, and developing and partially stripping the resist to leave a patterned resist over the substrate. The patterned resist is then used in subsequent etching processes in forming ICs. During such etching processes, some characteristics of the patterned resist, such as critical dimension (CD), line width roughness (LWR), and line edge roughness (LER), may be transferred to final IC features such as transistor gates. With the decrease of the IC device dimensions, the CD, LWR, and/or LER of transistor gates (as well as other IC features) are being recognized as major concerns. Accordingly, advancement in lithography process is generally desirable to meet the demand of the continued semiconductor miniaturization.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
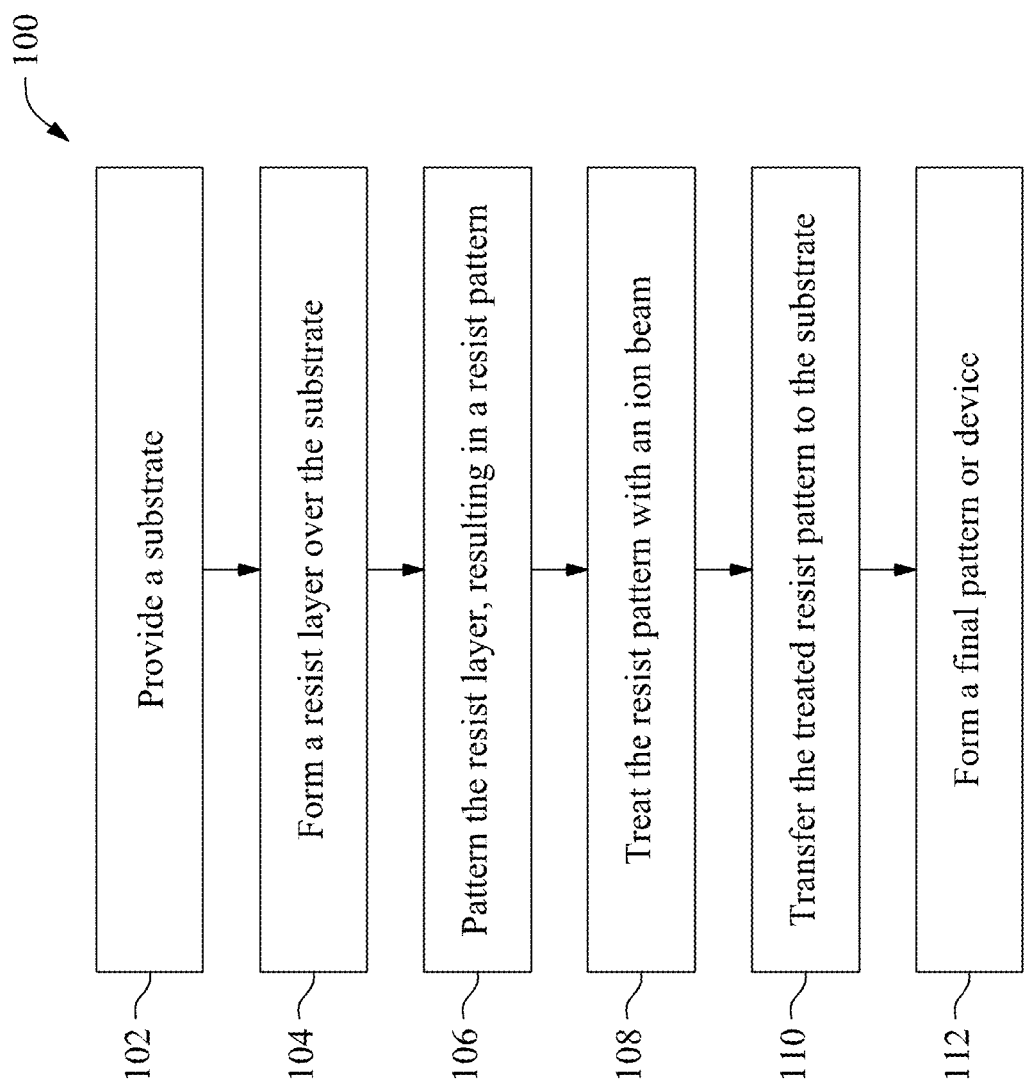
FIG. 1 is a flow chart of a method of forming a target pattern or device on a substrate for implementing one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to forming a pattern or device for an integrated circuit (IC) using a lithography process and more particularly, to treating a patterned resist layer so as to reduce its LWR, LER, and/or CD before the patterned resist layer is used in subsequent etching processes.

FIG. 1 shows a flow chart of a method 100 for forming a target pattern or device according to various aspects of the present disclosure. Additional operations can be provided before, during, and after the method 100, and some operations described can be replaced, eliminated, or moved around for additional embodiments of the method. The method 100 is an example, and is not intended to limit the present disclosure beyond what is explicitly recited in the claims. The method 100 is described below in conjunction with FIGS. 2-17.

Figure 2:
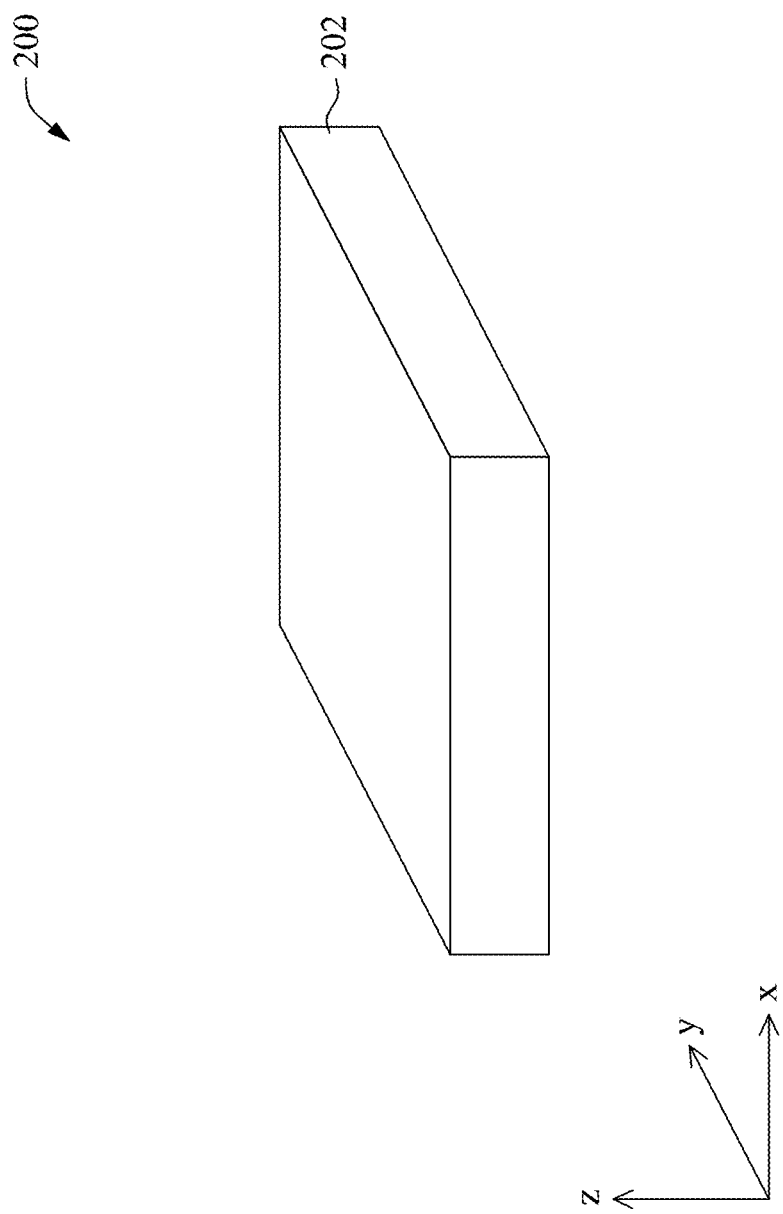
FIGS. 2, 3, 4, 7, 9, and 11 illustrate three dimensional views of forming a target pattern according to the method of FIG. 1, in accordance with some embodiments.

At operation 102, the method 100 (FIG. 1) provides a substrate 202 as shown in FIG. 2. Referring to FIG. 2, in various embodiments, the substrate 202 includes one or more material layers and is in an intermediate step of a fabrication process to form a device 200. The device 200 may be an IC, or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The device 200 may include three-dimensional devices and multi-gate devices such as double gate FETs, FinFETs, tri-gate FETs, omega FETs, Gate-All-Around (GAA) devices, and vertical GAA devices. In an embodiment, the substrate 202 is a semiconductor substrate (e.g., wafer). In an embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

Figure 3:
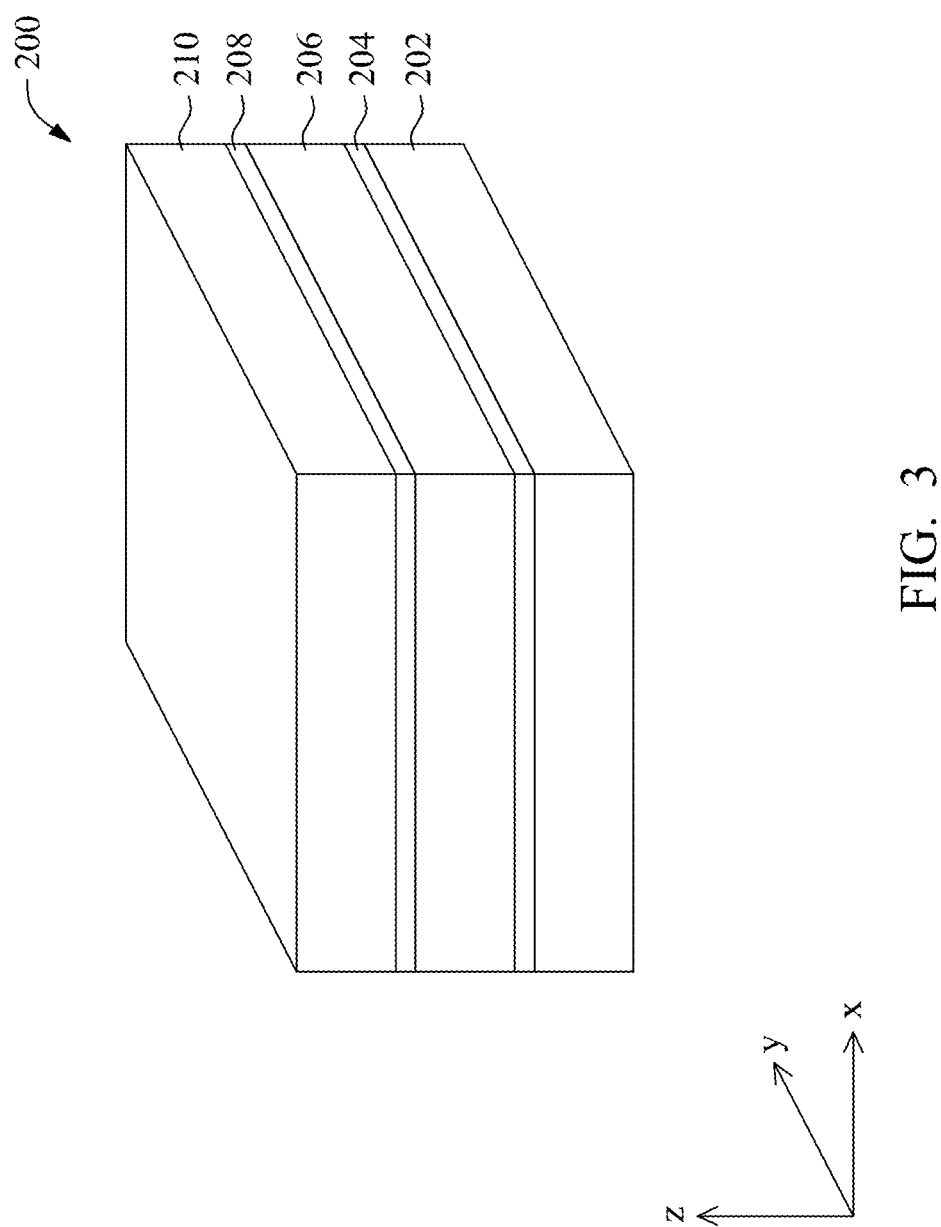

At operation 104, the method 100 (FIG. 1) forms a resist layer 210 over the substrate 202. Referring to FIG. 3, in the present embodiment, prior to the formation of the resist layer 210, one or more material layers are formed over the substrate 202 as etch layers, such as a hard mask layer 204, a bottom material layer 206, and an anti-reflection coating (ARC) layer 208. In various embodiments, some of the material layers 204/206/208 may be omitted and/or substituted, or alternatively, other material layers may be added between the resist layer 210 and the substrate 202. In an embodiment, the resist layer 210 is formed by a spin coating process followed by a soft baking process.

In various embodiments, the hard mask layer 204 may use amorphous silicon (a-Si), silicon oxide, silicon nitride (SiN), titanium nitride (TiN), silicon oxynitride (SiON), silicon carbon nitride (SiCN), or other suitable material or composition; the bottom material layer 206 may contain silicon, oxygen, and/or carbon, such as SOC or spin-on glass (SOG); the ARC layer 208 may be a polymeric material layer or a silicon-containing material layer, such as silicon oxide, silicon oxygen carbide, and plasma enhanced chemical vapor deposited silicon oxide. The various material layers 204, 206, and 208 may be formed by a variety of processes. For example, they may be formed by chemical vapor deposition (CVD), low pressure chemical vapor deposition (LPCVD), plasma enhanced chemical vapor deposition (PECVD), physical vapor deposition (PVD), atomic layer deposition (ALD), or other suitable deposition method. For example, the hard mask layer 204 may be formed by CVD using chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

The resist layer 210 can be a positive resist or a negative resist. A positive resist is normally insoluble in a resist developer, but is made soluble by exposure to a radiation such as a deep ultraviolet (DUV) ray, an extreme ultraviolet (EUV) ray, an electron beam (e-beam), an x-ray, or other suitable radiation. One exemplary positive resist material is chemically amplified resist (CAR) that contains backbone polymer protected by acid labile groups (ALGs). A negative resist has the opposite behavior—normally soluble in a resist developer, but is made insoluble by exposure to a radiation, such as a DUV ray, an EUV ray, an e-beam, an x-ray, or other suitable radiation. One exemplary negative resist is a polymer which forms intra-molecular and/or intermolecular cross links when irradiated, such as a polymerization of Ethyl(α-hydroxy)acrylate (EHMA) and methacryl acid (MAA).

Figure 4:
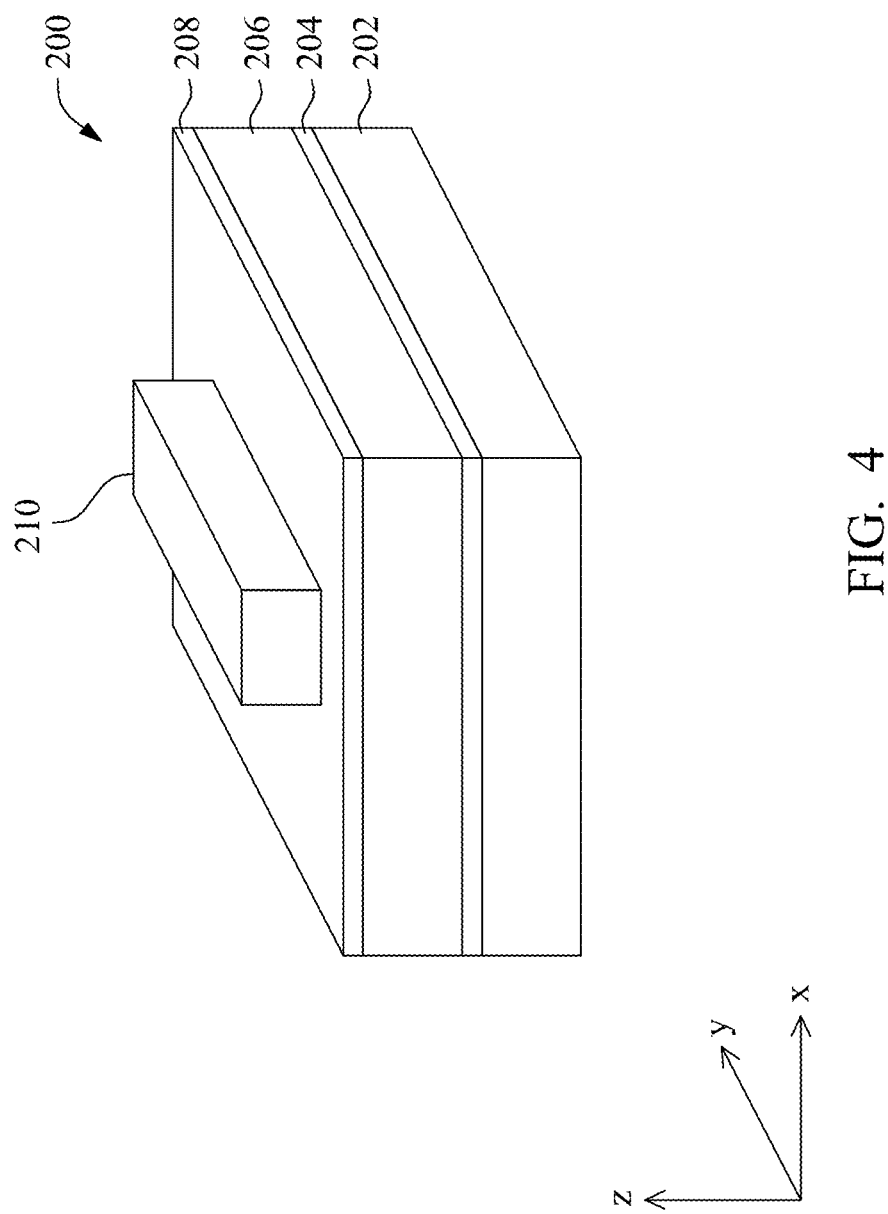

At operation 106, the method 100 (FIG. 1) patterns the resist layer 210 thereby forming a resist pattern. In an embodiment, the patterning process transfers a pattern from a mask (or a photo-mask or a reticle) to the resist layer 210. Alternatively, the patterning process may use a maskless patterning technique such as electron beam direct writing (EBDW). In an embodiment, patterning the resist layer 210 includes exposing the resist layer 210 to a radiation, post-exposure baking, developing the resist layer 210 in a resist developer, and hard baking thereby removing exposed portion (or unexposed in the case of negative resist) of the resist layer 210 and leaving unexposed portions thereof on the ARC layer 208 as the resist pattern. The radiation may be a DUV ray, an EUV ray, an e-beam, an x-ray, an ion beam, or other suitable radiation. In embodiments where a mask is used to pattern the resist layer 210, the mask can be of different types, such as a transmissive mask or a reflective mask, and can be formed in various technologies, such as binary mask or phase shift mask (PSM). In one example, a binary mask includes a transparent substrate (e.g., fused quartz), and an opaque material (e.g., chromium) coated in the opaque regions of the mask. In another example, a PSM includes various features configured to have proper phase difference to enhance the resolution and imaging quality. In the present example, the resist layer 210 is patterned to form a line pattern 210 (FIG. 4). For the sake of simplification, the line pattern 210 is oriented lengthwise in "y" direction, widthwise in "x" direction, and height-wise in "z" direction. In the present example, the single line pattern 210 is used for simplification and ease of understanding and does not necessarily limit the embodiment to any number of line patterns, any arrangement of line pattern, and/or other types of patterns such as trench patterns, hole patterns, patterns with bends, and so on.

Figure 6:
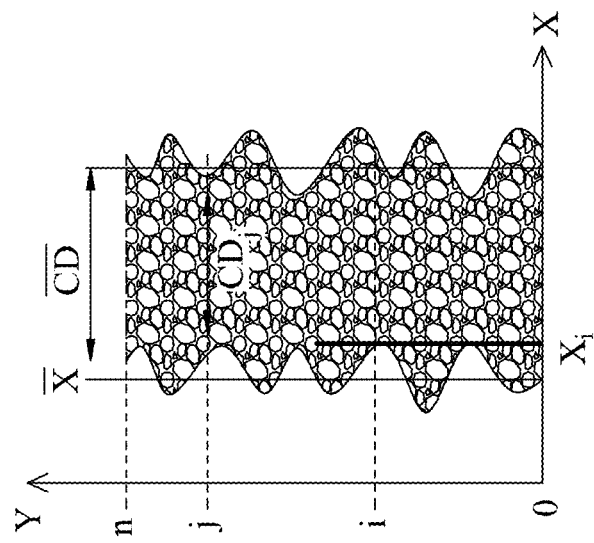
FIGS. 5 and 6 illustrate edge roughness, width roughness, and critical dimension of a patterned resist layer.
Figure 5:
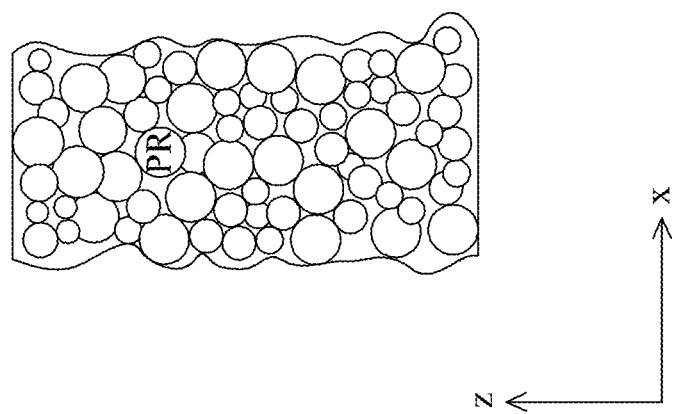

In a typical lithography process, an etching process is subsequently followed, which etches the ARC layer 208 using the line pattern 210 as an etch mask thereby transferring the pattern to the ARC layer 208 and subsequently to the substrate 202 through more etching processes. Issues arise when the pattern is transferred from the resist pattern 210 to the ARC layer 208. For example, the line pattern 210 may not have ideal critical dimension (CD). For example, its dimension in the "x" direction (or its width) may be greater than an IC design target. For another example, the line pattern 210 may have undesirable surface roughness, such as line edge roughness (LER) and/or line width roughness (LWR). FIG. 5 illustrates a cross-sectional view of the line pattern 210, showing roughness of its sidewalls. FIG. 6 illustrates surface roughness along the line pattern 210 in the "y" direction (or its length direction). In the present embodiment, LER is defined as a 3σ deviation of an edge from a line fit to that edge, or mathematically, $LER = 3\sqrt{\sum_{i=0}^{n}(x_i - \bar{x})^2 / n}$ and LWR is defined as a 3σ deviation of a line width along the line, or mathematically, $LWR = 3\sqrt{\sum_{j=0}^{n}(CD_j - \overline{CD})^2 / n}$. Such non-ideal CD and undesirable LER/LWR may be transferred from the line pattern 210 to the ARC layer 208 and eventually to the substrate 202, causing IC fabrication issues. For example, the line pattern 210 may be used to pattern transistor gate electrodes whose gate length corresponds to the width of the line pattern 210. Gate length is a critical feature of a transistor because it may affect power consumption and/or switching speed of the transistor. Undesirable CD and LER/LWR can cause the gate length to be out of design specification. To make the matter worse, during etching processes, such as dry etching frequently used in gate patterning, the line pattern 210 undergoes severe degradation due to lack of etch selectivity, resulting in resist film loss and increased LER/LWR. The present disclosure addresses the above problems by treating a patterned resist layer, such as the line pattern 210, with ion beams before using it in subsequent etching processes. Lab experiments have shown that embodiments of the present disclosure can reduce CD, LER, and/or LWR of the resist patterns. This is very desirable for advanced process nodes, such as 10 nanometer (nm) and beyond.

Figure 7:
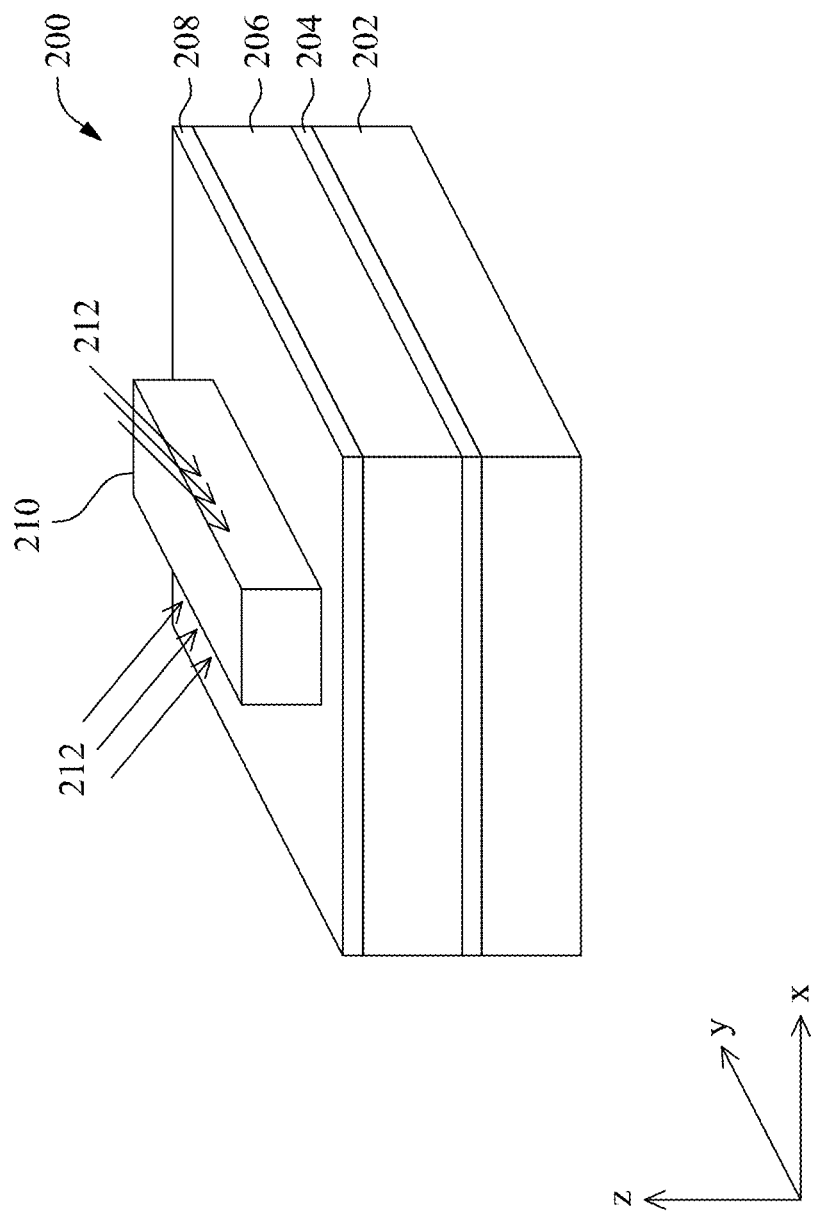
Figure 8:
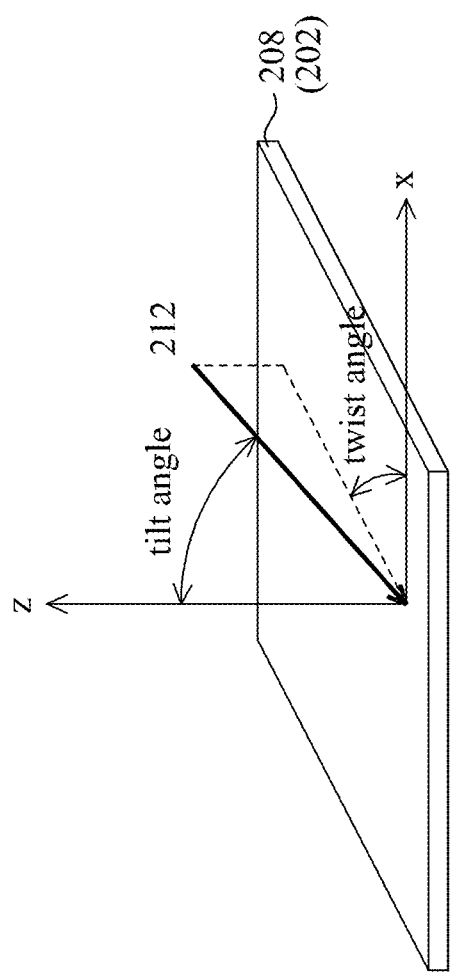
FIG. 8 illustrates tilt angles and twist angles of an ion beam incident upon a substrate according to the method of FIG. 1, in accordance with an embodiment.

At operation 108, the method 100 (FIG. 1) treats the line pattern 210 with an ion beam 212. In embodiments, the ion beam 212 is generated by an ion implanter. Referring to FIG. 7, in the present embodiment, the ion beam 212 is a focused beam of ions. To further the present embodiment, the ion beam 212 is directed towards the line pattern 210 (or towards the top surface of the ARC layer 208 or the substrate 202 for that matter) at an angle tilted from a normal to the top surface of the ARC layer 208 (i.e., the "z" axis in the present example). This angle of incidence is called a "tilt angle" in the present disclosure, and is illustrated in FIG. 8. FIG. 8 also shows a "twist angle" of the ion beam 212 which is the angle between the plane containing the ion beam 212 and the "z" axis, and the plane containing the "x" and "z" axes. The tilt angle and twist angle collectively define the direction of incidence of the ion beam 212. Referring back to FIG. 7, in the present embodiment, the ion beam 212 is directed towards the line pattern 210 at a tilt angle greater than or equal to 10 degrees. In some instances, the tilt angle is set to be greater than 30 degrees so as to reduce resist film loss. In an embodiment, the ion beam 212 is directed towards the line pattern 210 at a uniform twist angle, such as being at about zero (0) degrees. In another embodiment, the ion beam 212 is directed towards the line pattern 210 at a uniform twist angle at about 90 degrees (i.e. parallel with the line pattern 210).

In various embodiments, the ion beam 212 is generated by an ion implanter with a gas as the ion source. In an embodiment, the gas is Argon (Ar) and the ion beam 212 is provided with ion energy from about 1.0 keV to about 3.5 keV and ion dose from about $1 \times 10^{16}$ ions/cm$^2$ to about $10 \times 10^{16}$ ions/cm$^2$. In an embodiment, the gas is Helium (He) and the ion beam 212 is provided with ion energy from about 1 keV to about 5 keV and ion dose from about $1 \times 10^{16}$ ions/cm$^2$ to about $10 \times 10^{16}$ ions/cm$^2$. In an embodiment, the gas is Silane (SiH$_4$) and the ion beam 212 is provided with ion energy from about 2 keV to about 5 keV and ion dose from about $0.5 \times 10^{16}$ ions/cm$^2$ to about $3 \times 10^{16}$ ions/cm$^2$. In an embodiment, the gas is Methane (CH$_4$) and the ion beam is provided with ion energy from about 1 keV to about 5 keV and ion dose from about $1 \times 10^{16}$ ions/cm$^2$ to about $6 \times 10^{16}$ ions/cm$^2$. In various embodiments, the gas may be one of: CH$_4$, SiH$_4$, Ar, He, O$_2$, N$_2$, CO$_2$, other suitable gases, and a combination thereof. In an embodiment, the ion beam 212 is generated with Ar, has a tilt angle from about 19 degrees to about 30 degrees and a twist angle about 0 degrees, and is provided with ion energy from about 1 keV to about 1.5 keV and ion dose from about $0.5 \times 10^{16}$ ions/cm$^2$ to about $3 \times 10^{16}$ ions/cm$^2$. In various embodiments, the device 200 moves relative to the ion beams 212 so that the line pattern 210 is scanned uniformly by the ion beams 212 along its length.

Figure 14:
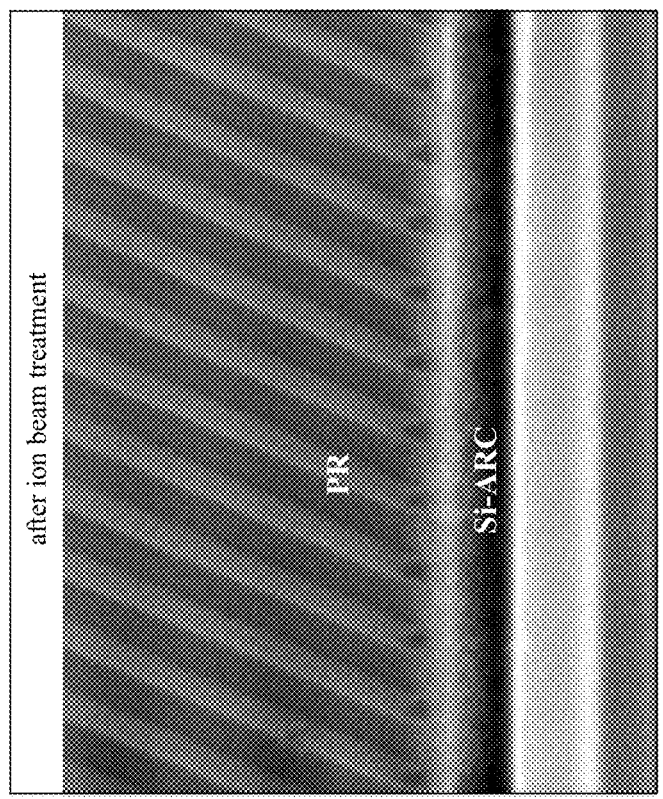
FIGS. 13, 14, 15, 16, and 17 are images and data from lab experiments implemented according to the method of FIG. 1, in accordance with an embodiment.
Figure 13:
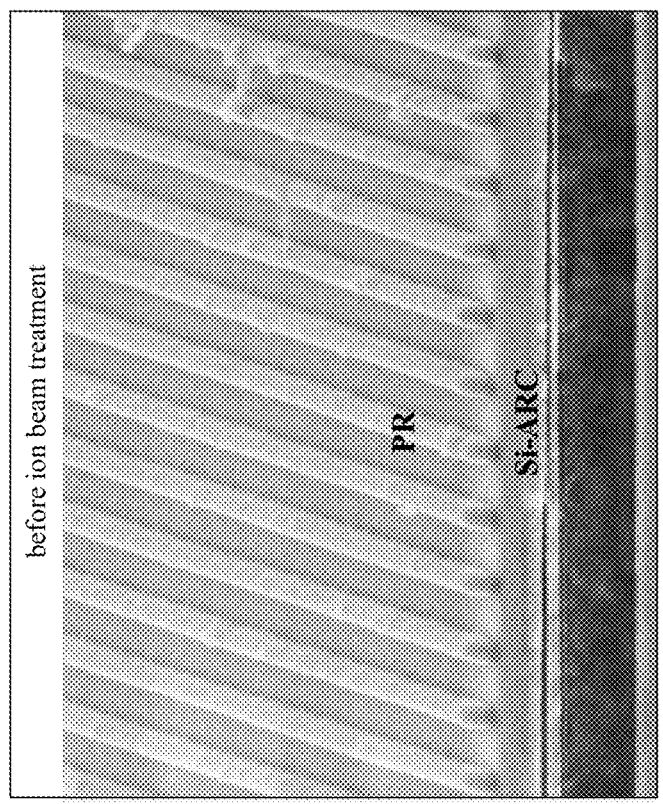
Figure 15:
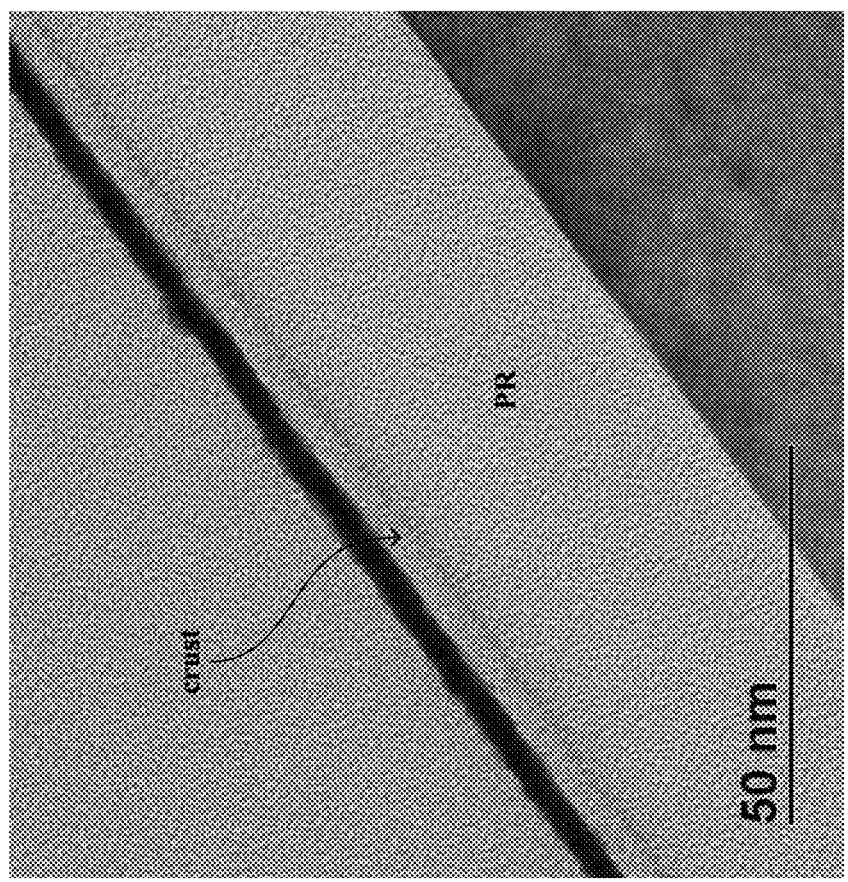
Figure 16:
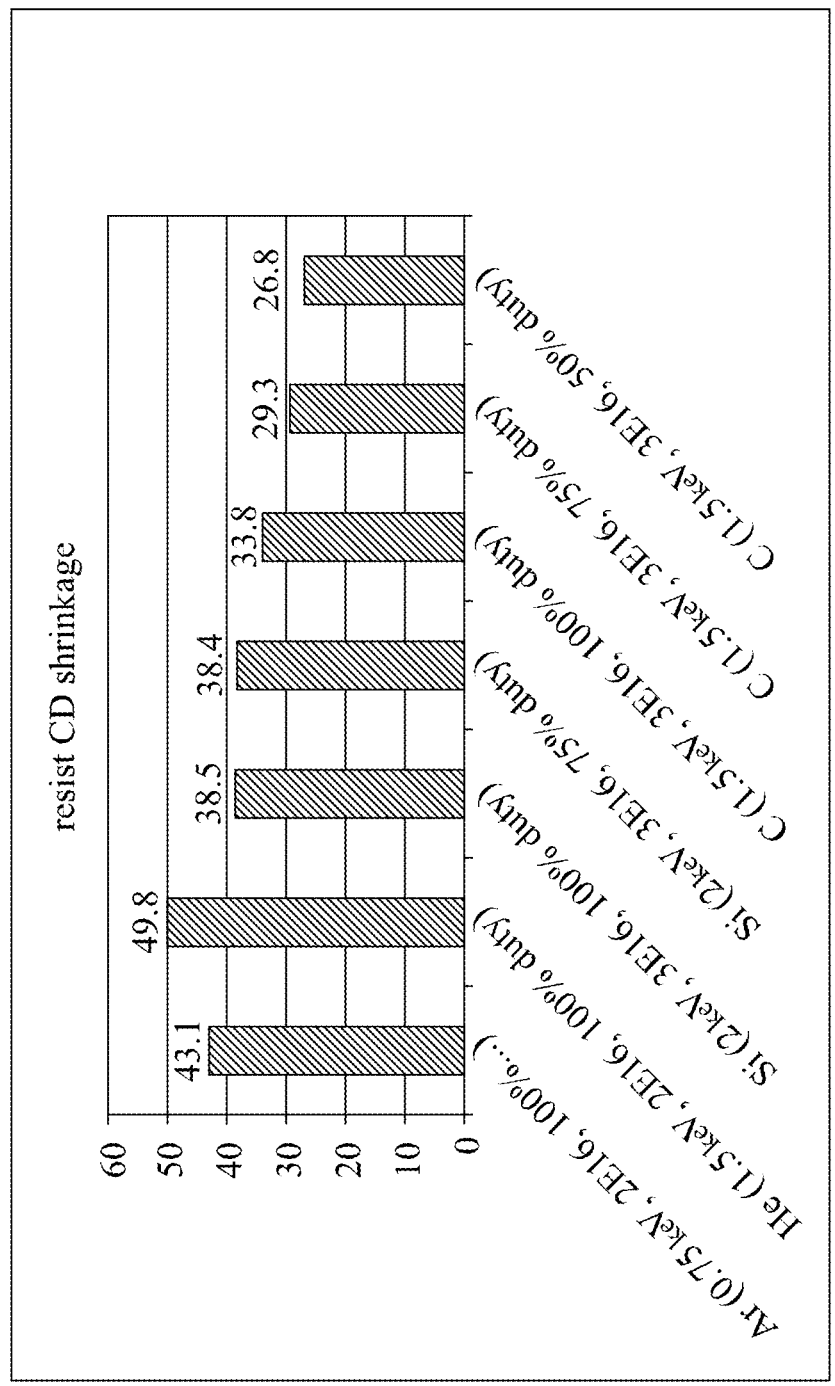
Figure 17:
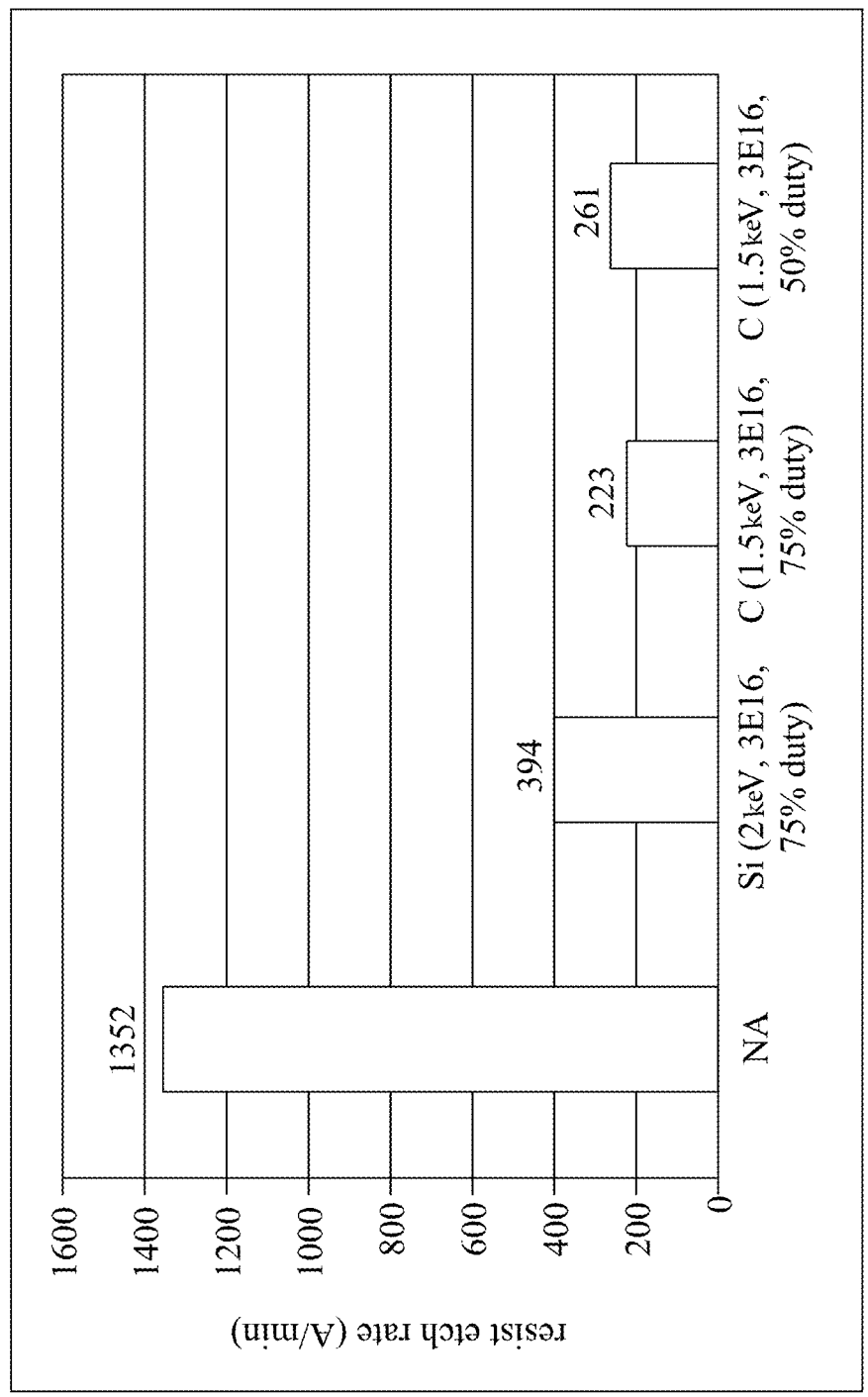

While the mechanism of the ion beam treatment does not affect the scope of the claims, it is believed that, in some embodiments, the ion beam 212 not only trims the line pattern 210 to reduce its width and to smooth out its surfaces including sidewalls, but also causes chemical reaction in the resist material up to certain depths into the line pattern 210, depending on how far the ions are traveled inside the resist material. The chemical reaction changes the characteristics of the resist material. For example, it may cause the line pattern 210's etch rate to decrease. FIGS. 13-17 show various images and data obtained from lab experiments according to various embodiments of the present disclosure, manifesting the effectiveness of the ion beam treatment. FIG. 13 is an image of resist line patterns after resist development and before ion beam treatment. As shown therein, the resist line patterns are formed over a silicon-containing ARC layer and exhibit some surface roughness. FIG. 14 is an image of the resist line patterns after undergoing ion beam treatment according to an embodiment of the present disclosure. As can be seen, the treated resist line patterns (FIG. 14) have smoother surfaces and narrower width compared with those pre-treatment resist line patterns. FIG. 15 shows that a crust is formed on a surface of a resist pattern after it has undergone ion beam treatment according to an embodiment of the present disclosure. The crust is hardened resist material as a result of chemical reaction between the resist material and the ions. FIG. 16 shows resist pattern CD shrinkage of 26.8% to 49.8% has been achieved in various embodiments of the present disclosure using Ar, He, SiH$_4$, and CH$_4$ as the respective ion source. In addition, a general LWR reduction of 16% (with Ar ion beam treatment), 46% (with C ion beam treatment), and 38% (with Si ion beam treatment) has been reported. A general LER reduction has been reported to be similar to the LWR reduction, within few percentage points. FIG. 17 shows a graph of resist etch rate before and after ion beam treatment (s). As shown in FIG. 17, the resist etch rate decreases from pre-treatment of 1,352 Angstroms/minutes (Å/min) to after-treatment of less than 400 Å/min, which represents a general 3 to 6 times decrease in etch rate. Such etch rate decrease is very desirable in subsequent etching of the ARC layer 208 because it strengthens the resist pattern against the etchants to be used so as to reduce resist film loss and degradation of LER/LWR during the etching process. At the same time, the treated resist pattern retains a desirable ash rate for a subsequent resist ashing or stripping process. It has been reported that, in some instances, the resist pattern has an ash rate of about 4,000 Å/min, compared with about 7,000 Å/min before the ion beam treatment.

Figure 9:
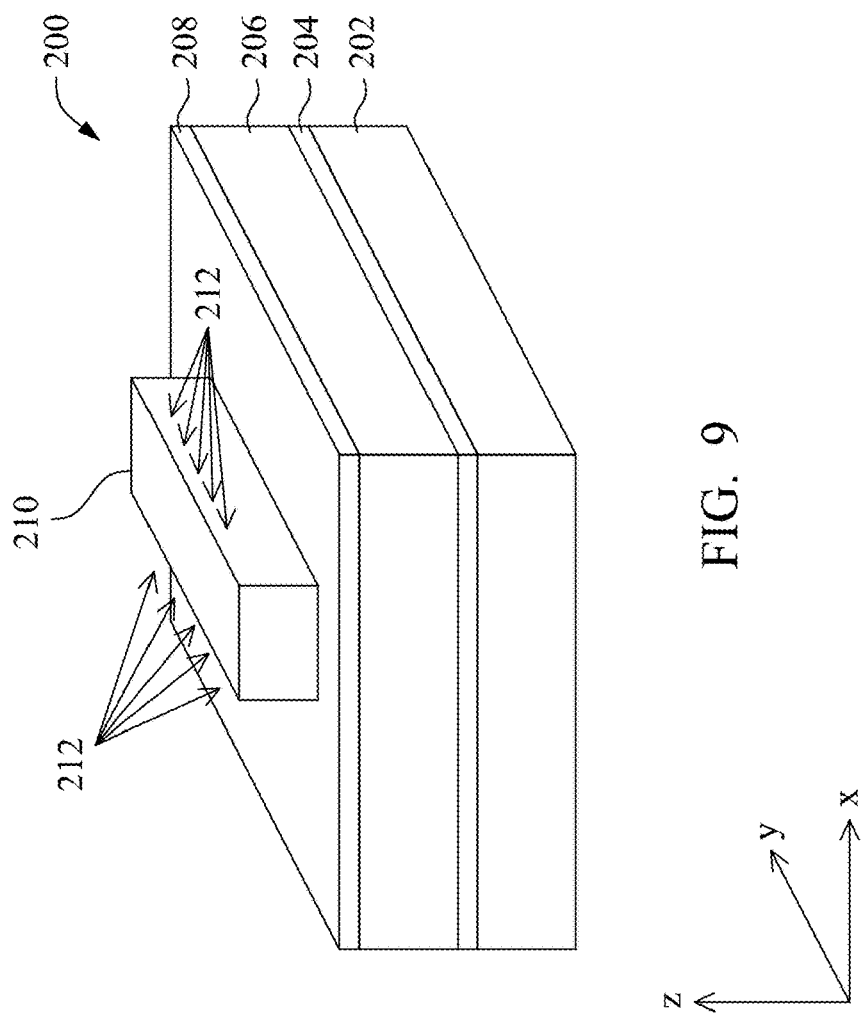
Figure 10:
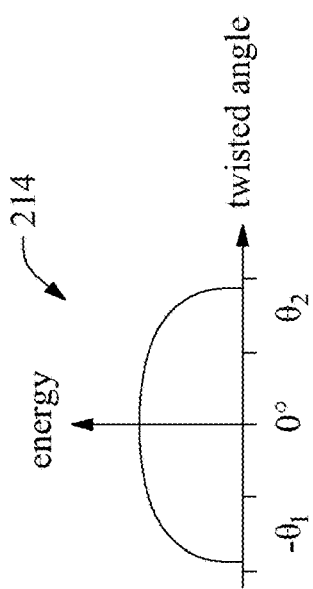
FIGS. 10 and 12 illustrate exemplary twist angle distributions of an ion beam according to the method of FIG. 1, in accordance with an embodiment.

In an embodiment, the ion beam 212 has more than one twist angle, meaning that various portions of the ion beam 212 are directed towards the line pattern 210 simultaneously at different twist angles. This is illustrated in FIG. 9. In effect, the ion beam 212 is delivered not as a focused beam, but as a fan-shaped beam. In an embodiment, the ion beam 212 has twist angles with a unimodal distribution 214 as shown in FIG. 10. The unimodal distribution 214 has an ion energy peak at the zero (0) degree twist angle and has ion energy substantially limited within a range from $-\theta_1$ to $+\theta_2$ degrees. In an embodiment, both $\theta_1$ and $\theta_2$ are about 50 degrees. In various embodiments, the unimodal distribution 214 may be asymmetrical about the zero degree twist angle or may have ion energy peak at a non-zero twist angle. In some instances, using an ion beam with a unimodal distribution twist angle is more effective than using an ion beam with a uniform twist angle because the former trims the surface of the line pattern 210 from different angles simultaneously.

Figures 11, 12:
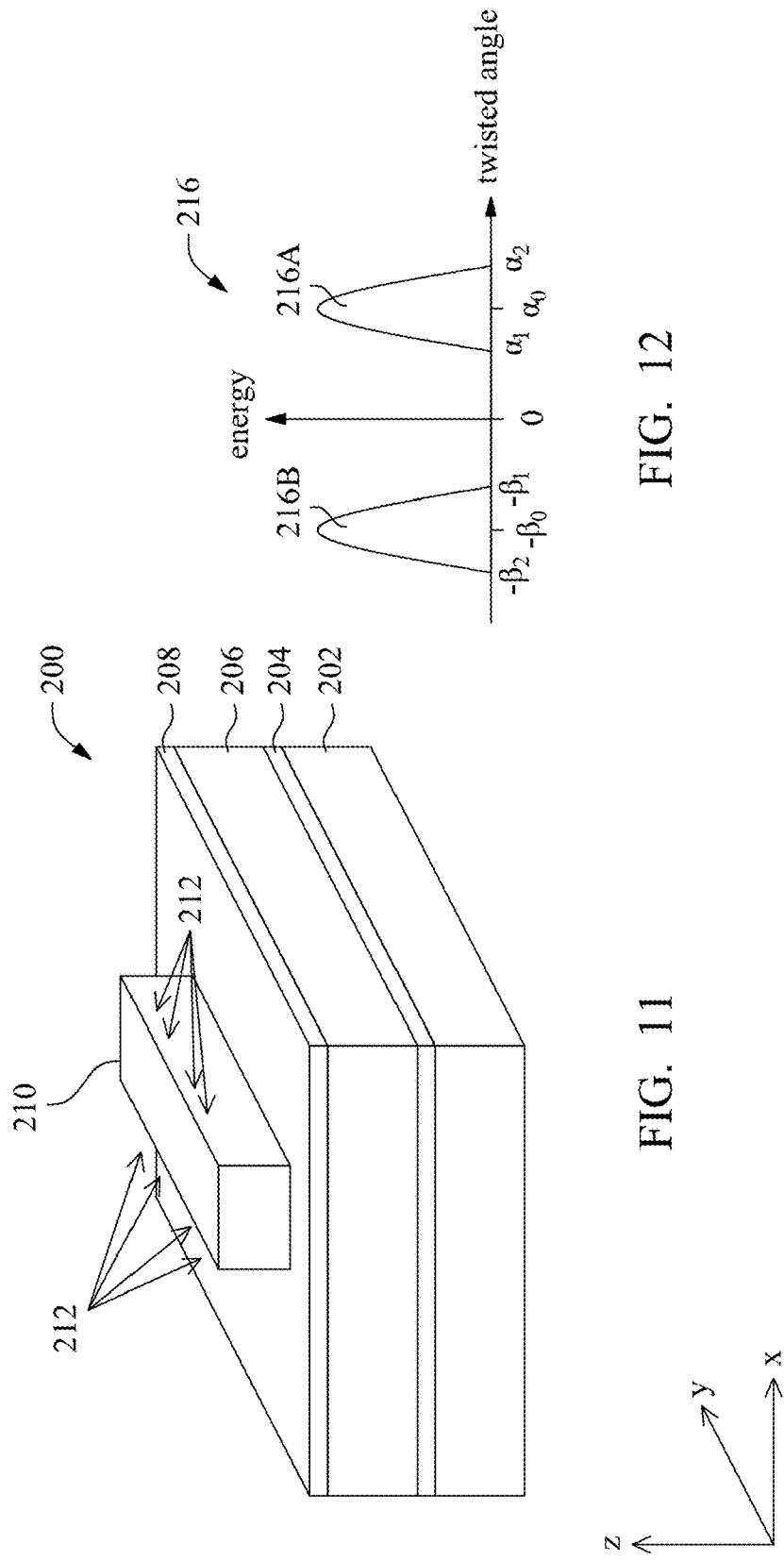

In an embodiment, the ion beam 212 has twist angles with a bimodal distribution 216 as illustrated in FIGS. 11 and 12. In effect, the ion beam 212 has two fan-shaped portions directed simultaneously towards the line pattern 210. As shown in FIG. 12, the bimodal distribution 216 has two unimodal distribution components, 216A and 216B, each corresponding to one of the two portions of the ion beam 212. The unimodal distribution 216A has an ion energy peak at $\alpha_0$ twist angle and has ion energy substantially limited within a range from $\alpha_1$ to $\alpha_2$ twist angles. In an embodiment, $\alpha_0$ is about 12.5 degrees, $\alpha_1$ about 7.5 degrees and $\alpha_2$ about 17.5 degrees. The unimodal distribution 216B has an ion energy peak at $\beta_0$ twist angle and has ion energy substantially limited within a range from $-\beta_1$ to $-\beta_2$ twist angles. In an embodiment, $\beta_0$ is about −12.5 degrees, $\beta_1$ about −7.5 degrees and $\beta_2$ about −17.5 degrees. In some embodiments, the unimodal distribution 216A (or 216B) may be asymmetrical about its center twist angle. For example, its energy peak may be closer to the $\alpha_2$ (or $\beta_2$) twist angle. In an embodiment, $\alpha_0$ is about 40 degrees, $\alpha_1$ about 20 degrees and $\alpha_2$ about 40 degrees. In some embodiments, the unimodal distributions 216A and 216B may partially overlap. In some instances, using an ion beam with a bimodal distribution twist angle is more effective than using an ion beam with a uniform twist angle or a unimodal distribution twist angle because the former not only trims the surface of the line pattern 210 from different angles simultaneously but also devotes more ion energy to attack the surface roughness from its sides.

In an embodiment, the ion beam 212 (FIGS. 7, 9, and 11) is a gas cluster ion beam (GCIB) such as an $O_2$ cluster, an Ar cluster, or a $CO_2$ cluster. For example, the ion beam 212 may be an Ar GCIB with average cluster size about 10,000 to about 20,000 atoms, average cluster charge +3, average cluster energy 65 keV, average cluster velocity 6.5 km/s, and a total electrical current of 200 uA or more.

At operation 110, the method 100 (FIG. 1) transfers the treated resist pattern 210 to the ARC layer 208 and subsequently to the substrate 202, through a process that includes etching processes. The etching processes may include dry (plasma) etching, wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The etching processes etch the ARC layer 208 using the treated resist pattern 210 as an etch mask. Due to the ion beam treatment of the resist pattern 210, the transferred pattern in the ARC layer 208 (as well as in the substrate 202) exhibits superior CD and LER/LWR compared with those in a typical lithography process. In an embodiment, after the ARC layer 208 has been etched, the line pattern 210 is removed, for example, by a wet etching process that uses a photoresist stripper, an aqueous alkaline solution, an amine-solvent mixture, or an organic solvent.

At operation 112, the method 100 (FIG. 1) proceeds to form a final pattern or device. In an embodiment, the resist pattern 210 is part of a shallow trench isolation (STI) feature definition. To further this embodiment, the method 100 transfers the treated resist pattern 210 to the hard mask layer 204 as an opening; etches the substrate 202 through the opening to form a trench therein; removes the hard mask layer 204; fills the trench with a dielectric material; and performs a chemical mechanical planarization (CMP) process to the dielectric material. In another embodiment, the resist pattern 210 is part of a gate electrode feature definition and the substrate 202 includes a layer of polysilicon over a layer of dielectric material such as silicon oxide ($SiO_2$) or silicon oxynitride (SiON). To further this embodiment, the method 100 transfers the treated resist pattern 210 to the hard mask layer 204 as a line; etches the polysilicon layer and the dielectric material layer with the patterned hard mask layer 204 as an etch mask thereby forming a gate stack; removes the patterned hard mask layer 204; and forms a spacer around the gate stack. In yet another embodiment, the resist pattern 210 is part of a contact feature definition, such as a source, drain, or gate contact. To further this embodiment, the method 100 transfers the treated resist pattern 210 to the hard mask layer 204 as an opening; etches the substrate 202 through the opening to form a contact hole thereby exposing a top surface of a terminal (source, drain, or gate); deposits a barrier layer in the contact hole; fills the remaining space of the contact hole with a conductive material such as aluminum (Al), tungsten (W), copper (Cu), or cobalt (Co); and performs a CMP process to planarize a top surface of the conductive material.

In an embodiment, the ion beam 212 is used to treat a material layer other than a resist layer. For example, the line pattern 210 is first transferred to the ARC layer 208 and then the patterned ARC layer 208 is treated with the ion beam 212. Experiments show that such treatment is also effective in reducing CD, LER and LWR of the patterned ARC layer 208 which is a polymeric material or a silicon-containing material. Similarly, the ion beam 212 can be used to treat the bottom material layer 206 after it has been patterned.

Although not intended to be limiting, the present disclosure provides many benefits. For example, various embodiments of the present disclosure treat a patterned resist layer with an ion beam so as to reduce CD, LER, and LWR of the patterned resist layer before it is used as an etch mask. This improves CD uniformity of the final IC devices. In various embodiments, the ion beam can be generated with various gas species, such as Ar, He, $CH_4$, and $SiH_4$, and with various ion energy and ion dose to select, which makes embodiments of the present disclosure adaptable to different applications and flows. In various embodiments, the ion beam is directed at the patterned resist layer with a tilt angle and a twist angle, which contributes to resist pattern sidewall smoothing without much film loss. In addition, having a unimodal or bimodal twist angle distribution in conjunction with a tilt angle helps overcome shadow effect when treating dense resist patterns with the ion beam. Furthermore, various embodiments of the present disclosure can be implemented in all types of IC fabrication processes where lithography is used, such as nano-wire patterning in vertical gate-all-around (VGAA) devices, STI patterning, gate electrode patterning, contact patterning, and so on. In fact, the specific embodiments discussed so far are only examples and do not limit the inventive scope of the present disclosure beyond what is explicitly recited in the claims.

In one exemplary aspect, the present disclosure is directed to a method of patterning a substrate. The method includes patterning a resist layer formed over the substrate, resulting in a resist pattern; and treating the resist pattern with an ion beam, resulting in a treated resist pattern, wherein the ion beam is generated with a first gas and is directed towards the resist pattern at a tilt angle at least 10 degrees. The method further includes etching the substrate with the treated resist pattern as an etch mask. In various embodiments, the ion beam is directed towards the resist pattern at a uniform twist angle, with a unimodal distribution twist angle, or with a bimodal distribution twist angle.

In another exemplary aspect, the present disclosure is directed to a method of patterning an etch layer over a substrate. The method includes forming a resist layer over the etch layer; patterning the resist layer, resulting in a patterned resist layer; and performing ion implantation to the patterned resist layer, resulting in a treated patterned resist layer. The step of performing ion implantation includes providing a treatment gas containing $CH_4$, $SiH_4$, Ar, or He; generating an ion beam from the treatment gas; and directing the ion beam incident upon the substrate at a tilt angle. The method further includes etching the etch layer with the treated patterned resist layer as an etch mask.

In yet another exemplary aspect, the present disclosure is directed to a method of forming an integrated circuit. The method includes patterning a material layer over a substrate, resulting in a patterned material layer; and treating the patterned material layer with an ion beam generated with one of: $CH_4$, $SiH_4$, Ar, and He, and directed incident upon the substrate at a tilt angle greater than 10 degrees, resulting in a treated patterned material layer. The method further includes etching the substrate with the treated patterned material layer. In various embodiments, the material layer can be a resist layer, a silicon-containing ARC layer, or a material layer containing silicon, oxygen, and carbon.

In one exemplary aspect, the present disclosure is directed to a method. The method includes patterning a resist layer formed over a substrate, resulting in a resist pattern; and transferring the resist pattern to an anti-reflection coating (ARC) layer formed under the resist layer and over the substrate, resulting in a patterned ARC layer. The method further includes treating the patterned ARC layer with an ion beam, resulting in a treated patterned ARC layer, wherein the ion beam is generated with a first gas and is directed towards the patterned ARC layer at a tilt angle at least 10 degrees. The method further includes etching the substrate with the treated patterned ARC layer as an etch mask.

In another exemplary aspect, the present disclosure is directed to a method. The method includes forming a bottom material layer over a substrate, forming an anti-reflection coating (ARC) layer over the bottom material layer; and forming a resist layer over the ARC layer. The method further includes patterning the resist layer, resulting in a patterned resist layer; and performing ion implantation to the patterned resist layer, resulting in a treated patterned resist layer. The performing of the ion implantation includes providing a treatment gas containing $CH_4$, $SiH_4$, Ar, or He; generating an ion beam from the treatment gas; and directing the ion beam incident upon the patterned resist layer at a tilt angle of at least 10 degrees. The method further includes etching the ARC layer with the treated patterned resist layer as an etch mask, resulting in a patterned ARC layer; and performing the ion implantation to the patterned ARC layer.

In yet another exemplary aspect, the present disclosure is directed to a method. The method includes patterning a material layer over a substrate to result in a patterned material layer, wherein the material layer is other than a resist layer. The method further includes treating the patterned material layer with an ion beam generated with one of: $CH_4$, $SiH_4$, Ar, and He, and directed incident upon the substrate at a tilt angle greater than 10 degrees, resulting in a treated patterned material layer. The method further includes etching the substrate with the treated patterned material layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    patterning a resist layer formed over a substrate, resulting in a resist pattern;
    transferring the resist pattern to an anti-reflection coating (ARC) layer formed under the resist layer and over the substrate by etching the ARC layer, resulting in a patterned ARC layer, wherein the patterned ARC layer includes a line pattern;
    after the transferring of the resist pattern to the ARC layer, treating the patterned ARC layer with an ion beam, resulting in a treated patterned ARC layer, wherein the ion beam is generated with a first gas and is directed towards the patterned ARC layer at a tilt angle at least 10 degrees; and
    etching the substrate with the treated patterned ARC layer as an etch mask.

2. The method of claim 1, further comprising:
    treating the resist pattern with the ion beam before transferring the resist pattern to the ARC layer.

3. The method of claim 1, wherein the ion beam is directed towards the patterned ARC layer at twist angles having a unimodal distribution from about −50 degrees to about 50 degrees, wherein the twist angle of the ion beam is an angle between a first plane and a second plane, the first plane containing the ion beam and a first axis perpendicular to a top surface of the ARC layer and the second plane containing the first axis and a second axis being the widthwise direction of the line pattern.

4. The method of claim 1, wherein the ion beam is directed towards the patterned ARC layer at twist angles having a bimodal distribution with one ion energy peak at about 12.5 degrees and another ion energy peak at about −12.5 degrees, wherein the twist angle of the ion beam is an angle between a first plane and a second plane, the first plane containing the ion beam and a first axis perpendicular to a top surface of the ARC layer and the second plane containing the first axis and a second axis being the widthwise direction of the line pattern.

5. The method of claim 1, wherein the first gas is Ar and the ion beam is provided with ion energy from about 1.0 ke V to about 3.5 ke V and ion dose from about $1\times1016$ ions/cm2 to about $10\times1016$ ions/cm2.

6. The method of claim 1, wherein the first gas is He and the ion beam is provided with ion energy from about 1 ke V to about 5 ke V and ion dose from about $1\times1016$ ions/cm2 to about $10\times1016$ ions/cm2.

7. The method of claim 1, wherein the first gas is SiH4 and the ion beam is provided with ion energy from about 2 ke V to about 5 ke V and ion dose from about $0.5\times1016$ ions/cm2 to about $3\times1016$ ions/cm2.

8. The method of claim 1, wherein the first gas is CH4 and the ion beam is provided with ion energy from about 1 ke V to about 5 ke V and ion dose from about $1\times1016$ ions/cm2 to about $6\times1016$ ions/cm2.

9. The method of claim 1, wherein the etching of the substrate with the treated patterned ARC layer results in a patterned material layer over the substrate, further comprising:
    treating the patterned material layer with the ion beam.

10. The method of claim 1, further comprising removing the treated patterned ARC layer.

11. A method, comprising:
    forming a bottom material layer over a substrate;

forming an anti-reflection coating (ARC) layer over the bottom material layer;

forming a resist layer over the ARC layer;

patterning the resist layer, resulting in a patterned resist layer;

performing ion implantation to the patterned resist layer, resulting in a treated patterned resist layer, wherein the performing of the ion implantation comprises:
- providing a treatment gas containing CH4, SiH4, Ar, or He;
- generating an ion beam from the treatment gas; and
- directing the ion beam incident upon the patterned resist layer at a tilt angle of at least 10 degrees;

etching the ARC layer with the treated patterned resist layer as an etch mask, resulting in a patterned ARC layer, wherein the patterned ARC layer includes a line pattern; and performing another ion implantation to the patterned ARC.

12. The method of claim 11, wherein the ion beam has an ion dose of at least $0.5 \times 10^{16}$ ions/cm2.

13. The method of claim 11, wherein the ion beam is directed incident upon the substrate at twist angles having a unimodal distribution, wherein the twist angle of the ion beam is an angle between a first plane and a second plane, the first plane containing the ion beam and a first axis perpendicular to a top surface of the ARC layer and the second plane containing the first axis and a second axis being the widthwise direction of the line pattern.

14. The method of claim 11, wherein the ion beam is directed incident upon the substrate at twist angles having a bimodal distribution, wherein the twist angle of the ion beam is an angle between a first plane and a second plane, the first plane containing the ion beam and a first axis perpendicular to a top surface of the ARC layer and the second plane containing the first axis and a second axis being the widthwise direction of the line pattern.

15. The method of claim 14, wherein the bimodal distribution comprises two unimodal distributions substantially limited within ranges from −17.5 degrees to −7.5 degrees and from 7.5 degrees to 17.5 degrees.

16. The method of claim 11, after performing the ion implantation to the patterned ARC layer, further comprising:
- etching the bottom material layer with the patterned ARC layer as an etch mask, resulting in a patterned bottom material layer; and
- performing the ion implantation to the patterned bottom material layer.

17. A method, comprising:
- patterning by etching a material layer over a substrate, the material layer being other than a resist layer, resulting in a patterned material layer having at least a line pattern;
- treating the patterned material layer with an ion beam generated with one of: CH4, SiH4, Ar, and He, and directed incident upon the substrate at a tilt angle greater than 10 degrees, resulting in a treated patterned material layer; and
- etching the substrate with the treated patterned material layer as a mask.

18. The method of claim 17, wherein the material layer is a silicon-containing anti-reflection coating (ARC) layer.

19. The method of claim 17, wherein the material layer contains silicon, carbon, and oxygen.

20. The method of claim 17, wherein the ion beam has a bimodal distribution of twist angles, the bimodal distribution comprising two unimodal distributions substantially limited within ranges from −17.5 degrees to −7.5 degrees and from 7.5 degrees to 17.5 degrees, wherein the twist angle of the ion beam is an angle between a first plane and a second plane, the first plane containing the ion beam and a first axis perpendicular to a top surface of the ARC layer and the second plane containing the first axis and a second axis being the widthwise direction of the line pattern.

* * * * *